United States Patent
Murakami et al.

(10) Patent No.: US 12,400,870 B2
(45) Date of Patent: Aug. 26, 2025

(54) SUBSTRATE PROCESSING METHOD AND SUBSTRATE PROCESSING APPARATUS

(71) Applicant: Tokyo Electron Limited, Tokyo (JP)

(72) Inventors: Hiroki Murakami, Nirasaki (JP); Shuichiro Sakai, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 257 days.

(21) Appl. No.: 17/905,438

(22) PCT Filed: Mar. 2, 2021

(86) PCT No.: PCT/JP2021/007986
§ 371 (c)(1),
(2) Date: Sep. 1, 2022

(87) PCT Pub. No.: WO2021/182189
PCT Pub. Date: Sep. 16, 2021

(65) Prior Publication Data
US 2023/0128868 A1  Apr. 27, 2023

(30) Foreign Application Priority Data
Mar. 11, 2020  (JP) .................................. 2020-042179

(51) Int. Cl.
*H01L 21/311* (2006.01)
*H01J 37/32* (2006.01)
*H01L 21/3065* (2006.01)

(52) U.S. Cl.
CPC .. *H01L 21/31116* (2013.01); *H01J 37/32449* (2013.01); *H01L 21/3065* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 10,269,566 B2 * | 4/2019 | Tan | H01J 37/32899 |
| 2016/0293432 A1 * | 10/2016 | Ranjan | H01L 21/3065 |
| 2018/0350620 A1 | 12/2018 | Zaitsu et al. | |
| 2019/0055654 A1 * | 2/2019 | George | C23C 16/403 |
| 2019/0206696 A1 * | 7/2019 | Hsu | H01L 21/32135 |
| 2019/0311909 A1 * | 10/2019 | Bajaj | H01L 21/32135 |

FOREIGN PATENT DOCUMENTS

| | | |
|---|---|---|
| JP | 2014-522104 A | 8/2014 |
| JP | 2017-063186 A | 3/2017 |
| JP | 2018-510515 A | 4/2018 |

* cited by examiner

*Primary Examiner* — Shamim Ahmed
(74) *Attorney, Agent, or Firm* — Armstrong Teasdale LLP

(57) ABSTRACT

A substrate processing method of etching an etching target film formed on a substrate includes: preparing the substrate having the etching target film; and etching the etching target film, wherein the etching the etching target film includes repeating, a plurality of times, supplying an etchant gas, and plasma-exciting a reaction gas to expose the substrate to plasma of the reaction gas.

8 Claims, 4 Drawing Sheets

SUBSTRATE PROCESSING METHOD AND SUBSTRATE PROCESSING APPARATUS

CROSS-REFERENCE TO RELATED APPLICATIONS

The present application is a U.S. National Stage Entry of International Patent Application No. PCT/JP2021/007986, filed Mar. 2, 2021, which claims the benefit of priority to Japanese Patent Application No. 2020-042179, filed Mar. 11, 2020, each of which is hereby incorporated herein by reference in its entirety.

TECHNICAL FIELD

The present disclosure relates to a substrate processing method and a substrate processing apparatus.

BACKGROUND

For example, a substrate processing apparatus for etching a silicon-based film formed on a substrate has been known.

Patent Document 1 discloses a method of etching a layer on a substrate in a semiconductor processing chamber, which includes: introducing a first gas, which is an etchant gas appropriate for etching the layer, into the chamber; retaining the first gas in the chamber for a certain period of time sufficient to adsorb at least a part of the first gas in the layer; substantially replacing the first gas in the chamber with an inert gas; generating a metastable gas from the inert gas; and etching the layer with the metastable gas.

PRIOR ART DOCUMENT

Patent Document

Patent Document 1: Japanese Patent Laid-open Publication No. 2014-522104.

SUMMARY

In one aspect, the present disclosure provides a substrate processing method and a substrate processing apparatus capable of obtaining good etching characteristics.

In order to solve the above-mentioned problem, according to one aspect, there is provided a substrate processing method of etching an etching target film formed on a substrate. The method includes: preparing the substrate having the etching target film; and etching the etching target film, wherein the etching the etching target film includes repeating, a plurality of times, supplying an etchant gas, and plasma-exciting a reaction gas to expose the substrate to plasma of the reaction gas.

According to one aspect, it is possible to provide a substrate processing method and a substrate processing apparatus capable of obtaining good etching characteristics.

DETAILED DESCRIPTION

Figure 1:
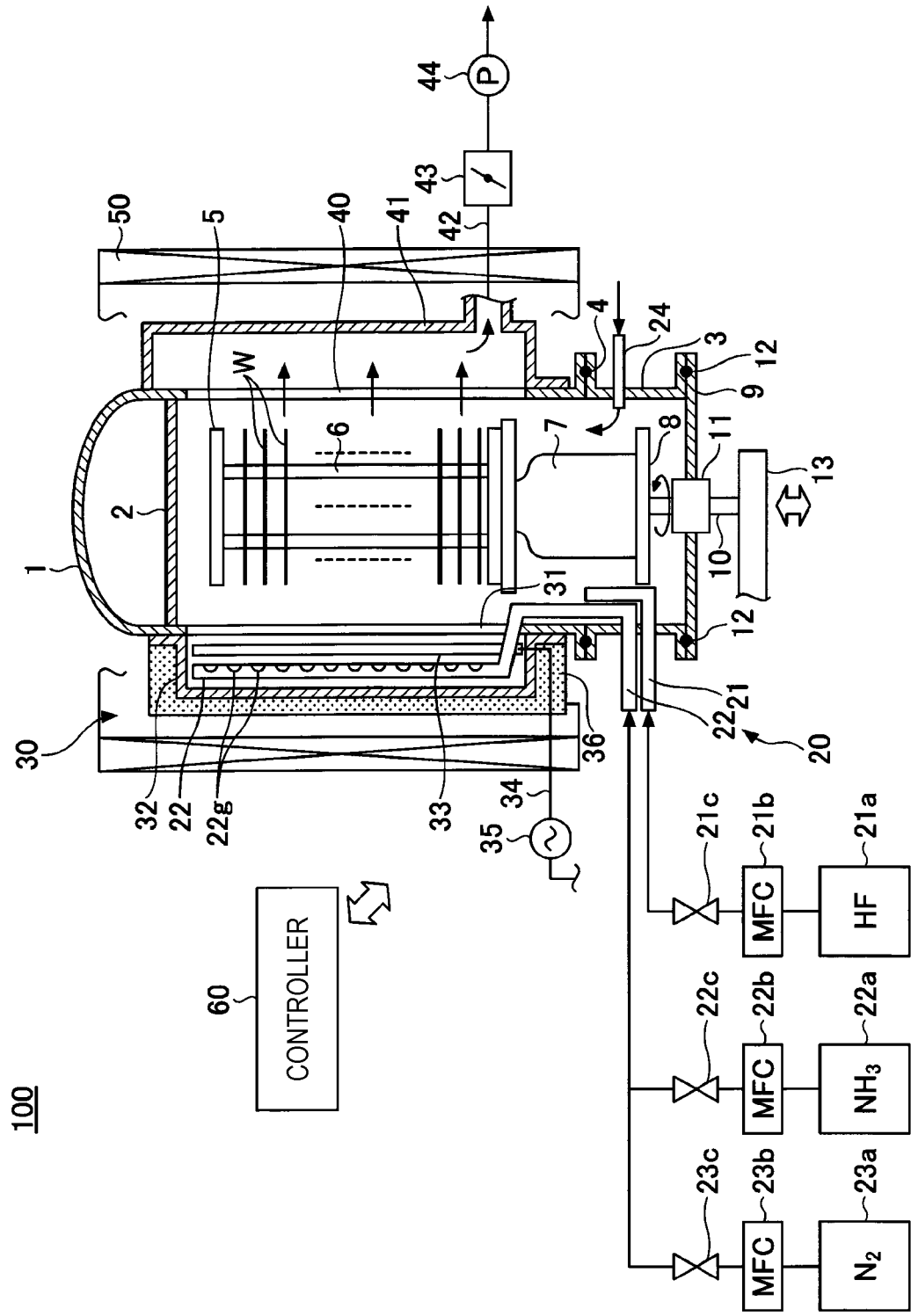
FIG. 1 is a schematic view showing a configuration example of a plasma processing apparatus.

Hereinafter, embodiments for carrying out the present disclosure will be described with reference to the drawings. In each drawing, the same components will be denoted by the same reference numerals, and redundant explanations thereof may be omitted.

<Substrate Processing Apparatus>

A plasma processing apparatus (substrate processing apparatus) 100 according to the present embodiment will be described with reference to FIG. 1. FIG. 1 is a schematic view showing a configuration example of a plasma processing apparatus 100.

The plasma processing apparatus 100 includes a cylindrical processing container 1 with a ceiling and an open lower end. The entire processing container 1 is made of, for example, quartz. A ceiling plate 2 made of quartz is provided in the processing container 1 in a vicinity of an upper end of the processing container 1, and a region below the ceiling plate 2 is sealed. A metallic manifold 3 molded into a cylindrical shape is connected to an opening at the lower end of the processing container 1 via a seal 4 such as an O-ring.

The manifold 3 supports the lower end of the processing container 1, and a wafer boat 5, in which a plurality of (e.g., 25 to 150) semiconductor wafers (hereinafter referred to as "substrates W") is loaded in multiple stages, is inserted into the processing container 1 from below the manifold 3. The plurality of substrates W is accommodated substantially horizontally in the processing container 1 at intervals along a vertical direction. The wafer boat 5 is made of, for example, quartz. The wafer boat 5 has three rods 6 (two of which are shown in FIG. 1), and the plurality of substrates W is supported by grooves (not shown) formed in the rods 6.

The wafer boat 5 is placed on a table 8 with a thermal insulating tube 7 interposed therebetween. The thermal insulating tube 7 is made of quartz. The table 8 is supported on a rotary shaft 10, which penetrates a metallic (stainless steel) lid 9 configured to open and close an opening at a lower end of the manifold 3.

A magnetic fluid seal 11 is provided at the penetrating portion of the rotary shaft 10 to airtightly seal and rotatably support the rotary shaft 10. A seal 12 for maintaining airtightness inside the processing container 1 is provided between a peripheral portion of the lid 9 and the lower end of the manifold 3.

The rotary shaft 10 is provided at a tip of an arm 13 supported by an elevating mechanism (not shown) such as a boat elevator. The wafer boat 5 and the lid 9 are integrally moved up and down to be inserted and separated with respect to an interior of the processing container 1. In addition, the table 8 may be fixedly provided on the lid 9 to process the substrates W without rotating the wafer boat 5.

In addition, the plasma processing apparatus 100 includes a gas supply 20 that supplies predetermined gases such as a processing gas and a purge gas into the processing container 1.

The gas supply 20 includes gas pipes 21, 22, and 24. The gas pipe 21 is made of, for example, quartz. The gas pipe 21 is a quartz pipe inwardly penetrating a sidewall of the manifold 3 and then being bent upward. The gas pipe 22 is made of, for example, quartz. The gas pipe 22 inwardly penetrates the sidewall of the manifold 3, is bent upward, and then extends vertically. A plurality of gas holes 22g is formed at predetermined intervals in a vertical portion of the gas pipe 22 over a vertical length corresponding to a wafer support range of the wafer boat 5. Each gas hole 22g discharges a gas in a horizontal direction. The gas pipe 24 is made of, for example, quartz. The gas pipe 24 is a short quartz pipe penetrating the sidewall of the manifold 3.

An etchant gas is supplied from an etchant gas source 21a to the gas pipe 21 via a gas line. The gas line is provided with a flow rate controller 21b and an on-off valve 21c. Thus, the etchant gas from the etchant gas source 21a is supplied into the processing container 1 via the gas line and the gas pipe 21. As the etchant gas, hydrogen fluoride (HF), for example, may be used. In addition, the etchant gas is not limited thereto, and a hydrogen halide and a halogenated compound such as $F_2$, $Cl_2$, $Br_2$, $I_2$, HCl, $BCl_3$, HBr, HI, $NF_3$, $ClF_3$, $CF_4$, and the like may be used.

The vertical portion (vertically-extending portion in which the gas holes 22g are formed) of the gas pipe 22 is provided in a plasma generation space described below. A reaction gas containing hydrogen is supplied from a reaction gas source 22a to the gas pipe 22 via a gas line. The gas line is provided with a flow rate controller 22b and an on-off valve 22c. In addition, nitrogen gas ($N_2$) is supplied from a reaction gas source 23a to the gas pipe 22 via a gas line. The gas line is provided with a flow rate controller 23b and an on-off valve 23c. Thus, a gas mixture of the reaction gas containing hydrogen and the nitrogen gas from the reaction gas sources 22a and 23a is supplied to the plasma generation space via the gas lines and the gas pipe 22, and is plasmarized in the plasma generation space and supplied into the processing container 1. As the reaction gas containing hydrogen, $NH_3$ gas or $H_2$ gas, for example, may be used. In addition, the reaction gas is not limited thereto, and a gas containing at least hydrogen (H) or deuterium (D) such as $H_2$, $N_2H_4$, $C_2H_4$, $NH_3$, or $D_2$ may be used.

A purge gas is supplied from a purge gas source (not shown) to the gas pipe 24 via a gas line. The gas line (not shown) is provided with a flow rate controller (not shown) and an on-off valve (not shown). Thus, the purge gas from the purge gas source is supplied into the processing container 1 via the gas line and the gas pipe 24. As the purge gas, an inert gas such as argon (Ar) or nitrogen ($N_2$), for example, may be used. Although the case where the purge gas is supplied from the purge gas source into the processing container 1 via the gas line and the gas pipe 24 has been described, the present disclosure is not limited thereto. The purge gas may be supplied from any of the gas pipes 21 and 22.

A plasma generation mechanism 30 is formed on a part of the sidewall of the processing container 1. The plasma generation mechanism 30 plasmarizes the $NH_3$ gas (or $H_2$ gas) to generate hydrogen (H) radicals, and plasmarizes the $N_2$ gas to generate active species for nitration.

The plasma generation mechanism 30 includes a plasma partition wall 32, a pair of plasma electrodes 33 (one of which is shown in FIG. 1), a feed line 34, a radio frequency power supply 35, and an insulating protective cover 36.

The plasma partition wall 32 is airtightly welded to an outer wall of the processing container 1. The plasma partition wall 32 is made of, for example, quartz. The plasma partition wall 32 has a concave cross section, and covers an opening 31 formed in the sidewall of the processing container 1. The opening 31 is vertically elongated so as to cover all the substrates W supported in the wafer boat 5 in the vertical direction. The gas pipe 22 for discharging the gas mixture of the $NH_3$ gas and the $N_2$ gas is disposed in an inner space, which is defined by the plasma partition wall 32 and in communication with the interior of the processing container 1, i.e., the plasma generation space. In addition, the gas pipe 21 for discharging the etchant gas is provided at a position close to the substrates W along the inner sidewall of the processing container 1 outside the plasma generation space.

Each of the pair of plasma electrodes 33 (one of which is shown in FIG. 1) has an elongated shape. The plasma electrodes 33 are disposed on opposite sides of an outer wall surface of the plasma partition wall 32 so as to face each other along the vertical direction. Each plasma electrode 33 is held by, for example, a holder (not shown) provided on a side surface of the plasma partition wall 32. The feed line 34 is connected to a lower end of each plasma electrode 33.

The feed line 34 electrically connects each plasma electrode 33 to the radio frequency power supply 35. In the shown example, the feed line 34 has one end connected to the lower end of each plasma electrode 33 and the other end connected to the radio frequency power supply 35.

The radio frequency power supply 35 is connected to the lower end of each plasma electrode 33 via the feed line 34, and supplies radio frequency power of, for example, 13.56 MHz to the pair of plasma electrodes 33. Thus, the radio frequency power is applied to the plasma generation space defined by the plasma partition wall 32. The $NH_3$ gas (or $H_2$ gas) discharged from the gas pipe 22 is plasmarized in the plasma generation space to which the radio frequency power has been applied, and hydrogen radicals thus generated are supplied into the processing container 1 via the opening 31. In addition, the $N_2$ gas supplied from the gas pipe 22 is plasmarized in the plasma generation space to which the radio frequency power has been applied, and active species for nitration thus generated are supplied into the processing container 1 via the opening 31.

The insulating protective cover 36 is provided outside the plasma partition wall 32 so as to cover the plasma partition wall 32. A coolant passage (not shown) is provided in an inner portion of the insulating protective cover 36, and the plasma electrodes 33 are cooled by flowing a coolant such as a cooled nitrogen ($N_2$) gas through the coolant passage. Further, a shield (not shown) may be provided between the plasma electrodes 33 and the insulating protective cover 36 so as to cover the plasma electrodes 33. The shield is made of, for example, a good conductor such as a metal, and is grounded.

An exhaust port 40 for vacuum evacuation of the processing container 1 is provided in a sidewall portion of the processing container 1 facing the opening 31. The exhaust port 40 is vertically elongated so as to correspond to the wafer boat 5. An exhaust port cover 41, which is molded into a U-shaped cross section, is attached to a portion of the processing container 1 corresponding to the exhaust port 40 so as to cover the exhaust port 40. The exhaust port cover 41 extends upward along the sidewall of the processing container 1. An exhaust pipe 42 for evacuating the processing container 1 via the exhaust port 40 is connected to a lower portion of the exhaust port cover 41. The exhaust pipe 42 is connected to an exhaust device 44, which includes a pressure control valve 43 for controlling a pressure in the processing container 1, a vacuum pump, and the like. The interior of the processing container 1 is evacuated by the exhaust device 44 via the exhaust pipe 42.

In addition, a cylindrical heating mechanism 50 for heating the processing container 1 and the substrates W inside the processing container 1 is provided so as to surround an outer periphery of the processing container 1.

In addition, the plasma processing apparatus 100 includes a controller 60. The controller 60 controls, for example, operations of respective components of the plasma processing apparatus 100, such as supply and stop of respective gases by opening and closing the on-off valves 21c to 23c, gas flow rates by the flow rate controllers 21b to 23b, and evacuation by the exhaust device 44. In addition, the controller 60 controls, for example, on and off of the radio frequency power by the radio frequency power supply 35 and the temperature of the substrates W by the heating mechanism 50.

The controller 60 may be, for example, a computer or the like. In addition, a computer program that operates respective components of the plasma processing apparatus 100 is stored in a storage medium. The storage medium may be, for example, a flexible disk, a compact disk, a hard disk, a flash memory, a DVD, or the like.

Figure 2:
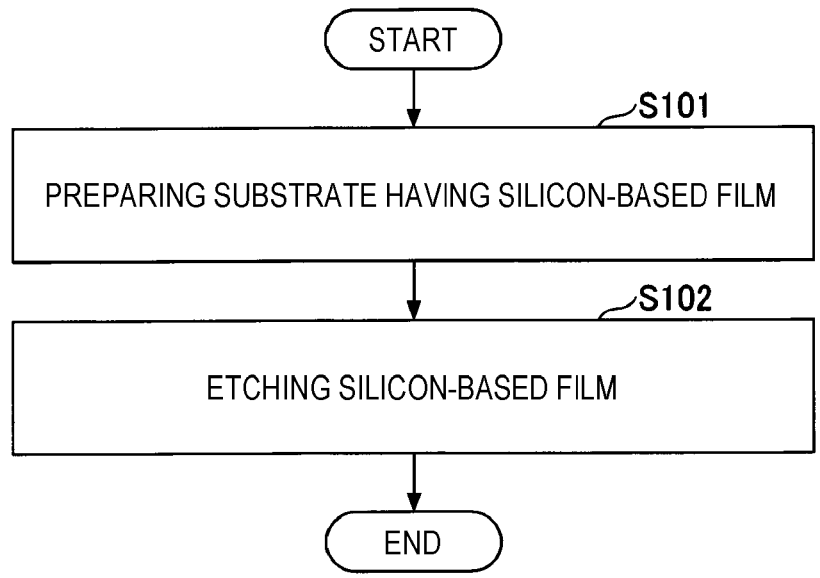
FIG. 2 is a flowchart illustrating an example of a substrate processing by the plasma processing apparatus.

Next, an example of a substrate processing by the plasma processing apparatus 100 shown in FIG. 1 will be described. FIG. 2 is a flowchart illustrating an example of a substrate processing by the plasma processing apparatus 100. The plasma processing apparatus 100 etches a silicon-based film as an etching target film formed on the substrate W.

In step S101, the substrate W having a silicon-based film is prepared. Specifically, the substrate W having the silicon-based film is set in the wafer boat 5. The arm 13 inserts the wafer boat 5 into the processing container 1 from the lower end of the manifold 3. Thereafter, the processing container 1 is made airtight by the lid 9.

In step S102, the silicon-based film of the substrate W is etched.

Figure 3:
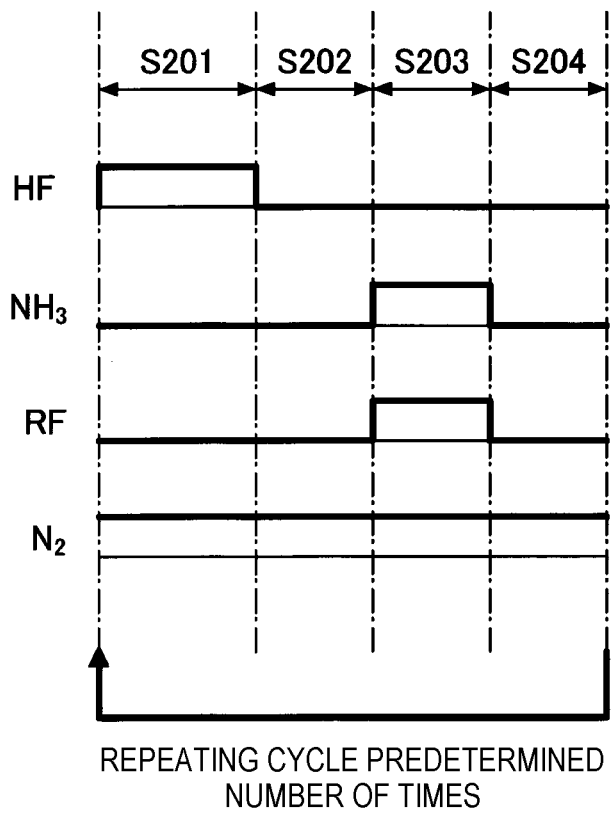
FIG. 3 is a time chart illustrating an example of an etching process by the plasma processing apparatus.

An etching process by the plasma processing apparatus 100 will be described with reference to FIG. 3. FIG. 3 is a time chart illustrating an example of an etching process by the plasma processing apparatus 100.

The etching process shown in FIG. 3 is a process of repeating a cycle a predetermined number of times, wherein the cycle includes step S201 of supplying an etchant gas, step S202 of purging, step S203 of applying RF power and supplying a reaction gas, and step S204 of purging, and alternately supplies the etchant gas and the reaction gas to etch a silicon-based film formed on the substrate W. FIG. 3 shows only one cycle. In addition, in steps S201 to S204, $N_2$ gas as a purge gas is continuously supplied from the gas pipe 24 during the etching process.

Step S201 of supplying the etchant gas is a process of supplying the etchant gas into the processing container 1. In step S201 of supplying the etchant gas, first, by opening the on-off valve 21c, the etchant gas is supplied from the etchant gas source 21a into the processing container 1 via the gas pipe 21. Thus, the etchant gas (HF gas) fluorinates a surface of the silicon-based film of the substrate W, such that the surface of the silicon-based film is brought into a state in which the fluorination reaction is saturated.

Step S202 of purging is a process of purging an excess etchant gas or the like in the processing container 1. In step S202 of purging, the on-off valve 21c is closed to stop the supply of the etchant gas. Thus, a purge gas, which is continuously supplied from the gas pipe 24, purges the excess etchant gas or the like in the processing container 1.

Step S203 of supplying the reaction gas is a process of supplying a gas mixture of $NH_3$ gas and $N_2$ gas as the reaction gas. In step S203 of supplying the reaction gas, by opening the on-off valves 22c and 23c, the reaction gas is supplied from the reaction gas sources 22a and 23a into the plasma partition wall 32 via the gas pipe 22. In addition, the RF power is applied to the plasma electrodes 33 by the radio frequency power supply 35 to generate plasma inside the plasma partition wall 32. Hydrogen (H) radicals and active species for nitration are generated and supplied into the processing container 1 from the opening 31. Thus, the hydrogen (H) radicals and the active species for nitration react with the surface of the fluorinated silicon-based film, such that a surface layer (one layer) of the fluorinated silicon-based film is etched.

Specifically, the hydrogen (H) radicals and the active species for nitration are supplied to the surface of the fluorinated silicon-based film, and a reaction product including silicon and fluorine such as $(NH_4)_2SiF_6$ is obtained. The generated $(NH_4)_2SiF_6$ is sublimated and discharged from the interior of the processing container 1 by the exhaust device 44. Thus, the surface of the silicon-based film is etched. The reaction product is a composition including Si and F, and is volatilized and removed in a temperature and pressure range of this process.

Step S204 of purging is a process of purging an excess reaction gas or reaction product $(NH_4)_2SiF_6$, or the like in the processing container 1. In step S204 of purging, the on-off valves 22c and 23c are closed to stop the supply of the reaction gas. Thus, the purge gas continuously supplied from the gas pipe 24 purges the excess reaction gas or reaction product, or the like inside the processing container 1.

By repeating the cycle described above, the silicon-based film formed on the substrate W is etched.

In a plasma etching process by the plasma processing apparatus 100 according to the present embodiment, a silicon-based film is etched by repeating fluorination of a film surface by an etchant gas, generation of a reaction product by reaction of the fluorinated film surface with plasma of a reaction gas, and sublimation of the generated reaction product from the substrate W. Thus, it is possible to uniformly (isotropically) etch the silicon-based film. That is, even a silicon-based film having a high aspect ratio recess may be uniformly etched on an entry side and an inner side of a sidewall of the recess. In addition, after performing the fluorination uniformly, by controlling activity of the reaction gas by the plasma or drawing of the active species along a depth direction, it is also possible to perform a control to preferentially etch an opening side of the recess, or the top and bottom of the recess.

Here, desirable ranges of a condition for etching the silicon-based film using the etchant gas and the reaction gas in step S102 are shown below:
Temperature: 25 degrees C. to 400 degrees C.;
Pressure: 0.1 Torr to 50.0 Torr;
HF gas flow rate: 100 sccm to 5,000 sccm;
$NH_3$ gas flow rate: 1,000 sccm to 10,000 sccm;
$N_2$ gas flow rate: 50 sccm to 10,000 sccm;
step S201 time: 5.0 seconds to 180 seconds;
step S202 time: 5.0 seconds to 60 seconds;
step S203 time: 5.0 seconds to 300 seconds;
step S204 time: 5.0 seconds to 60 seconds; and
RF power: 50 W to 500 W.

Figure 4:
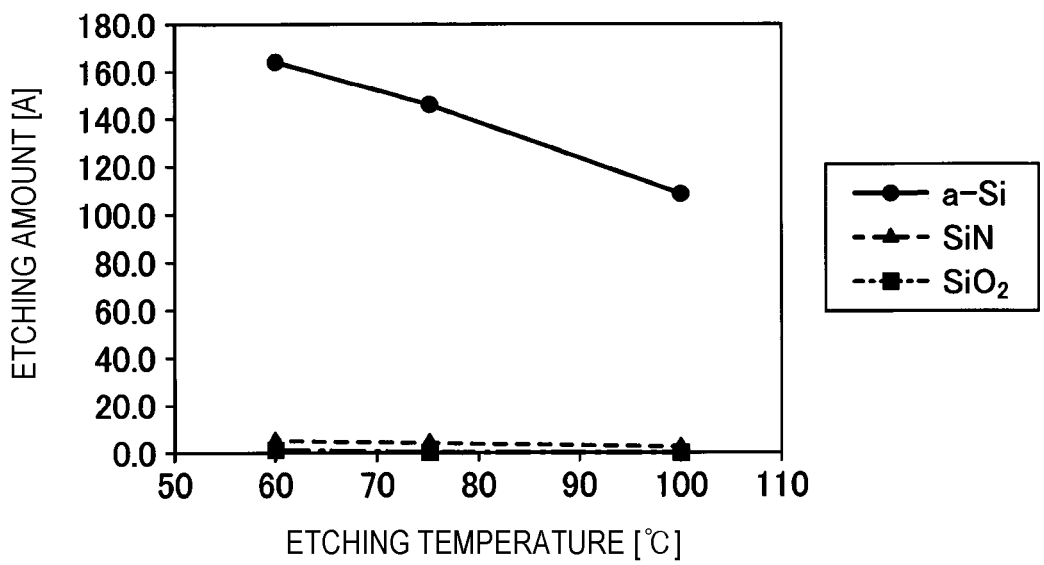
FIG. 4 is an example of a graph illustrating a relationship between an etching temperature and an etching amount for each film type of a silicon-based film.

FIG. 4 is an example of a graph showing a relationship between an etching temperature and an etching amount for each film type of a silicon-based film. The horizontal axis indicates the etching temperature (degrees C.), and the vertical axis indicates the etching amount (A). In addition, a result when the etching target is an amorphous silicon film is indicated by the solid line, a result when the etching target is a SiN film is indicated by the dashed line, and a result when the etching target is a $SiO_2$ film is indicated by the one-dot dashed line.

Figure 5:
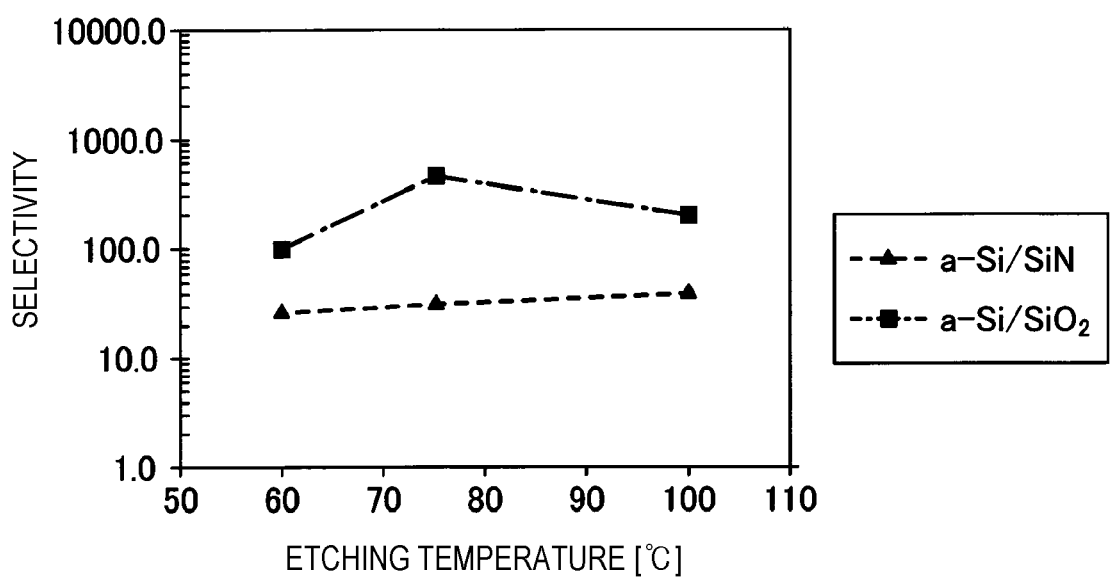
FIG. 5 is an example of a graph illustrating a selectivity between an amorphous silicon film and another silicon-based film (SiN film, $SiO_2$ film).

FIG. 5 is an example of a graph showing an etching selectivity between an amorphous silicon film and another silicon-based film (SiN film, $SiO_2$ film). The horizontal axis indicates the etching temperature (degrees C.), and the vertical axis indicates the selectivity. In addition, a selectivity of the amorphous silicon film to the SiN film is indicated by the dashed line, and a selectivity of the amorphous silicon film to the $SiO_2$ film is indicated by the one-dot dashed line.

As shown in FIGS. 4 and 5, with the plasma etching process by the plasma processing apparatus 100 according to the present embodiment, it is possible to appropriately etch the amorphous silicon film. Further, with the plasma etching process by the plasma processing apparatus 100 according to the present embodiment, it is possible to selectively etch the amorphous silicon film with respect to the SiN film or the $SiO_2$ film.

In addition, in the plasma etching process by the plasma processing apparatus 100 according to the present embodiment, a silicon film, a polysilicon film, or a crystalline silicon film also has high selectivity with respect to the SiN film or the $SiO_2$ film. Therefore, with the plasma etching process by the plasma processing apparatus 100 according to the present embodiment, it is possible to selectively etch the silicon film, the polysilicon film, or the crystalline silicon with respect to the SiN film or the $SiO_2$ film.

Figure 6:
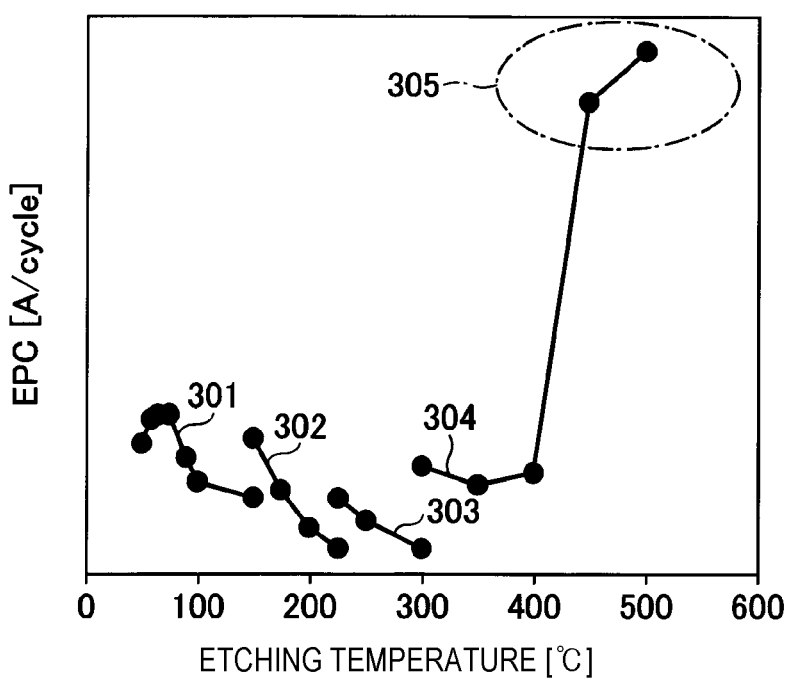
FIG. 6 is an example of graphs illustrating a relationship between a process temperature and an etching amount per cycle.

FIG. 6 is an example of graphs showing a relationship between a process temperature and an etching amount per cycle (EPC). The horizontal axis indicates the process temperature (degrees C.), and the vertical axis indicates the etching amount per cycle (A/cycle).

In graphs 301 to 304, the supply pressure and the supply time of the HF gas in step 201 (see FIG. 3) were set different from one another. Specifically, in graph 301, they were set to 1 Torr and 10 seconds. In graph 302, they were set to 5 Torr and 30 seconds. In graph 303, they were set to 9 Torr and 60 seconds. In graph 304, they were set to 27 Torr and 60 seconds.

In addition, the supply flow rate of the HF gas was set to 1 slm in common in graphs 301 to 304. The supply flow rate, the supply pressure, and the supply time of the $NH_3$ gas in step 203 (see FIG. 3) were set to 5 slm, 0.3 Torr, and 10 seconds, respectively, in common in graphs 301 to 304.

As shown in FIG. 6, in the plasma etching process by the plasma processing apparatus 100 according to the present embodiment, by controlling the supply pressure and the supply time of the HF gas, etching can be performed within a wide temperature range.

As described above, in the plasma etching process by the plasma processing apparatus 100 according to the present embodiment, it is possible to determine the etching temperature based on the supply pressure and the supply time of the HF gas. In other words, good etching characteristics can be obtained by appropriately selecting the supply pressure and the supply time of the HF gas with respect to a desired etching temperature.

In addition, in the vicinity of 400 degrees C., as shown in region 305, an increase in the etching amount per cycle was observed. The reason is because thermal etching components were superimposed due to an increase in thermal activity of HF.

In addition, in the plasma etching process by the plasma processing apparatus 100 according to the present embodiment, the etching target film may be a germanium-based film. Here, the germanium-based film includes at least one film selected from the group consisting of an amorphous silicon germanium film, a polycrystalline silicon germanium film, a single crystalline silicon germanium film, an amorphous germanium film, a polycrystalline germanium film, and a single crystalline germanium film.

Figure 7:
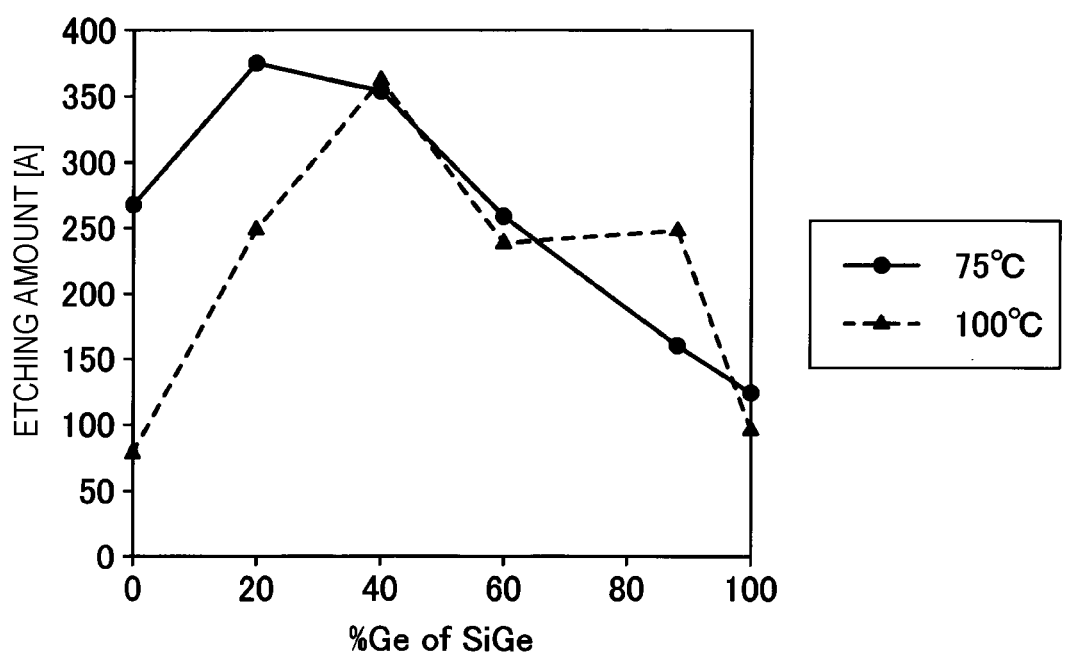
FIG. 7 is an example of a graph illustrating an etching amount of a germanium-based film.

FIG. 7 is an example of a graph showing an etching amount of a germanium-based film. The horizontal axis indicates a ratio of germanium (Ge) in a silicon-germanium-based film (SiGe), and the vertical axis indicates an etching amount (A). Further, a result when the process temperature is 75 degrees C. is indicated by the solid line, and a result when the process temperature is 100 degrees C. is indicated by the dashed line.

Here, as shown in comparison with FIGS. 4 and 7, the germanium-based film (see FIG. 7) has a higher etching amount than the SiN film or the $SiO_2$ film (see FIG. 4). That is, in the plasma etching process by the plasma processing apparatus 100 according to the present embodiment, the germanium-based film also has high selectivity with respect to the SiN film or the $SiO_2$ film. Therefore, with the plasma etching process by the plasma processing apparatus 100 according to the present embodiment, it is possible to selectively etch the germanium-based film with respect to the SiN film or the $SiO_2$ film.

Although the etching method of the present embodiment by the plasma processing apparatus 100 has been described above, the present disclosure is not limited to the above-described embodiment and the like, and various modifications and improvements can be made within the scope of the gist of the present disclosure described in the claims.

In step S101, the process of preparing the substrate W having a silicon-based film (etching target film) has been described as setting the substrate W having the silicon-based film in the processing container 1, but is not limited thereto. It may be a process of forming a silicon-based film on the substrate W in the processing container 1 by the plasma processing apparatus 100.

This application claims priority based on Japanese Patent Application No. 2020-42179 filed on Mar. 11, 2020, and the entire contents of this Japanese patent application is incorporated herein by reference.

EXPLANATION OF REFERENCE NUMERALS

W: substrate, 100: plasma processing apparatus (substrate processing apparatus), 1: processing container, 2: ceiling plate, 20: gas supply, 21, 22, 24: gas pipe, 21: gas pipe, 22: gas pipe, 22g: gas hole, 24: gas pipe, 21a: etchant gas source, 22a, 23a: reaction gas source, 30: plasma generation mechanism (radio frequency power supply), 44: exhaust device, 50: heating mechanism, 60: controller

What is claimed is:

1. A substrate processing method of etching an etching target film formed on a substrate, the method comprising:
preparing the substrate having the etching target film in a processing container; and
etching the etching target film in the processing container, wherein the etching the etching target film includes repeating, a plurality of times:
supplying an etchant gas; and
plasma-exciting a reaction gas to expose the substrate to plasma of the reaction gas, and
wherein the supplying the etchant gas includes controlling a pressure in the processing container and a supply time of the etchant gas according to an etching temperature of the etching target film.

2. The substrate processing method of claim 1, wherein the etchant gas includes a hydrogen halide.

3. The substrate processing method of claim 2, wherein the reaction gas includes H.

4. The substrate processing method of claim 3, wherein the reaction gas is a gas mixture of ammonia gas or hydrogen gas and nitrogen gas.

5. The substrate processing method of claim 4, wherein the etching target film includes a silicon-based film, and includes at least one selected from the group consisting of a silicon film, an amorphous silicon film, a polysilicon film, and a crystalline silicon film.

6. The substrate processing method of claim 5, wherein the etching target film includes a germanium-based film, and includes at least one selected from the group consisting of an amorphous silicon germanium film, a polycrystalline silicon germanium film, a single crystalline silicon germanium film, an amorphous germanium film, a polycrystalline germanium film, and a single crystalline germanium film.

7. The substrate processing method of claim 1, wherein the reaction gas includes H.

8. The substrate processing method of claim 1, wherein the etching target film includes a silicon-based film, and includes at least one selected from the group consisting of a silicon film, an amorphous silicon film, a polysilicon film, and a crystalline silicon film.

* * * * *